United States Patent
Kimura et al.

(10) Patent No.: US 10,566,400 B2
(45) Date of Patent: Feb. 18, 2020

(54) FLEXIBLE SEMICONDUCTOR DEVICE AND FLEXIBLE DISPLAY DEVICE

(71) Applicant: Japan Display Inc., Minato-ku (JP)

(72) Inventors: Yasukazu Kimura, Minato-ku (JP); Masato Hiramatsu, Minato-ku (JP); Takuma Nishinohara, Minato-ku (JP); Toshihiko Itoga, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/474,336

(22) Filed: Mar. 30, 2017

(65) Prior Publication Data

US 2017/0287999 A1    Oct. 5, 2017

(30) Foreign Application Priority Data

Apr. 1, 2016    (JP) .................. 2016-074492

(51) Int. Cl.
*H01L 27/32* (2006.01)
*H01L 27/12* (2006.01)
*H01L 51/00* (2006.01)

(52) U.S. Cl.
CPC ...... *H01L 27/3262* (2013.01); *H01L 27/1214* (2013.01); *H01L 27/3276* (2013.01); *H01L 51/0097* (2013.01); *H01L 2251/5338* (2013.01)

(58) Field of Classification Search
CPC ......... H01L 27/3262; H01L 2251/5338; H01L 51/0097; H01L 27/3276
See application file for complete search history.

(56) References Cited

U.S. PATENT DOCUMENTS

| 9,543,533 | B2* | 1/2017 | Yamazaki | H01L 51/0097 |
| 2005/0258423 | A1* | 11/2005 | Kuwabara | H01L 27/1214 257/66 |
| 2009/0027605 | A1* | 1/2009 | Denda | H01L 27/124 349/139 |
| 2012/0001190 | A1* | 1/2012 | Okabe | H01L 21/02532 257/66 |
| 2016/0211472 | A1* | 7/2016 | Oh | H01L 51/0097 |

FOREIGN PATENT DOCUMENTS

| JP | 2004-22875 | 1/2004 |
| JP | 2008-505352 | 2/2008 |
| WO | WO 2006/003622 A1 | 1/2006 |

* cited by examiner

*Primary Examiner* — Stephen M Bradley
(74) *Attorney, Agent, or Firm* — Oblon, McClelland, Maier & Neustadt, L.L.P.

(57) ABSTRACT

A display device includes a substrate having flexibility, a transistor having a gate insulating film and further having a semiconductor layer and a gate electrode that sandwich the gate insulating film, the transistor formed in an area where the substrate is bent, and a gate wiring line so formed on the substrate as to be connected to the gate electrode, and the gate electrode has an area that is present in an area where the gate electrode overlaps with the semiconductor layer and is thinner than at least part of the gate wiring line.

14 Claims, 7 Drawing Sheets

FLEXIBLE SEMICONDUCTOR DEVICE AND FLEXIBLE DISPLAY DEVICE

CROSS-REFERENCE TO RELATED APPLICATION

The present application claims priority from Japanese application JP2016-074492 filed on Apr. 1, 2016, the content of which is hereby incorporated by reference into this application.

BACKGROUND OF THE INVENTION

1. Field of the Invention

The present invention relates to a semiconductor device and a display device.

2. Description of the Related Art

There is a known display device including a substrate having flexibility and a gate electrode and a semiconductor layer that are provided on the substrate and so disposed as to be superimposed on each other to form the gate of a transistor. In the display device, in a case where the direction in which the substrate is bent coincides with the direction in which a lengthwise axis of the gate electrode is bent, the characteristics of the transistor undesirably change in some cases due to bending stress repeatedly induced in the gate electrode. JP 2008-505352 A, which has been made in view of the problem described above, discloses a configuration in which the transistor is skillfully so arranged that the direction in which the substrate is bent does not coincide with the direction in which the lengthwise axis of the gate electrode is bent.

In the configuration disclosed in JP 2008-505352 A, however, the transistor is arranged in a restricted manner, undesirably resulting in decrease in design flexibility.

SUMMARY OF THE INVENTION

An object of the invention is to lower bending stress induced in a gate electrode with no restriction on the arrangement of a transistor.

A semiconductor device according an aspect of the invention includes a substrate having flexibility, a transistor having a gate insulating film and further having a semiconductor layer and a gate electrode that sandwich the gate insulating film, the transistor formed in an area where the substrate is bent, and a gate wiring line so formed on the substrate but in an area where the gate wiring line does not overlap with the semiconductor layer as to be connected to the gate electrode, and the gate electrode has an area that is present in an area where the gate electrode overlaps with the semiconductor layer and is thinner than at least part of the gate wiring line.

A display device according to another aspect of the invention includes a substrate having flexibility, a plurality of pixels provided on the substrate to form a display area, a transistor having a gate insulating film and further having a semiconductor layer and a gate electrode that sandwich the gate insulating film, the transistor formed in an area where the substrate is bent, and a gate wiring line so formed on the substrate but in an area where the gate wiring line does not overlap with the semiconductor layer as to be connected to the gate electrode, and the gate electrode has an area that is present in an area where the gate electrode overlaps with the semiconductor layer and is thinner than at least part of the gate wiring line.

A display device according to a substrate having a bending part, a plurality of pixels provided on a display area, each of the plurality of pixels at the bending part including a transistor having a gate insulating film, a semiconductor layer and a gate electrode; and gate wiring line being connected to the gate electrode, wherein the gate insulating film is between the semiconductor layer and the pixel electrode, the gate wiring line does not overlap with the semiconductor layer in plan view, the gate electrode has an area overlaps with the semiconductor layer in plan view, and the gate electrode is thinner than the gate wiring line.

DETAILED DESCRIPTION OF THE INVENTION

An embodiment of the invention (hereinafter referred to as present embodiment) will be described below with reference to the drawings. The disclosed embodiment is presented only by way of example, and an appropriate change with the substance of the invention maintained that a person skilled in the art can readily conceive of, of course, falls within the scope of the invention. Further, to make the illustration in the drawings clearer, the width, thickness, shape, and other factors of each portion are diagrammatically drawn as compared with those in an actual aspect in some cases, but such a diagrammatically drawn portion is presented only by way of example and is not intended to limit the interpretation of the invention. In the present specification and drawings, the same element having been described in a figure having been shown has the same reference character and will not be described in detail as appropriate in some cases.

Further, in the present embodiment, when a positional relationship between a component and another component is defined, the words "on" and "below" suggest not only a case where the another component is disposed immediately on or below the component, but also a case where the component is disposed on or below the another component with a third component interposed therebetween.

[Overview of Display Device]

Figure 1:
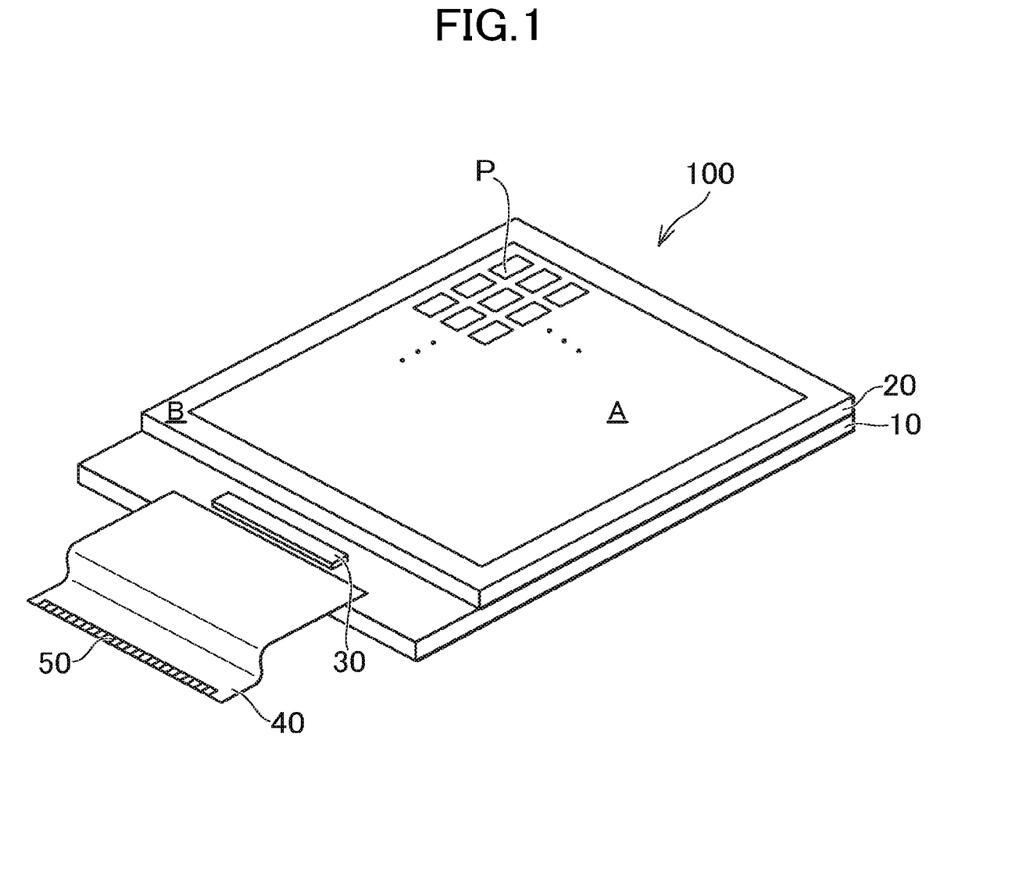
FIG. 1 is a perspective view of a display device in an embodiment of the invention.

An overview of a display device 100 according to the present embodiment will first be described with reference to FIGS. 1 and 2. FIG. 1 is a perspective view of the display device in the present embodiment, and FIG. 2 is a plan view of the display device in the present embodiment.

Figure 2:
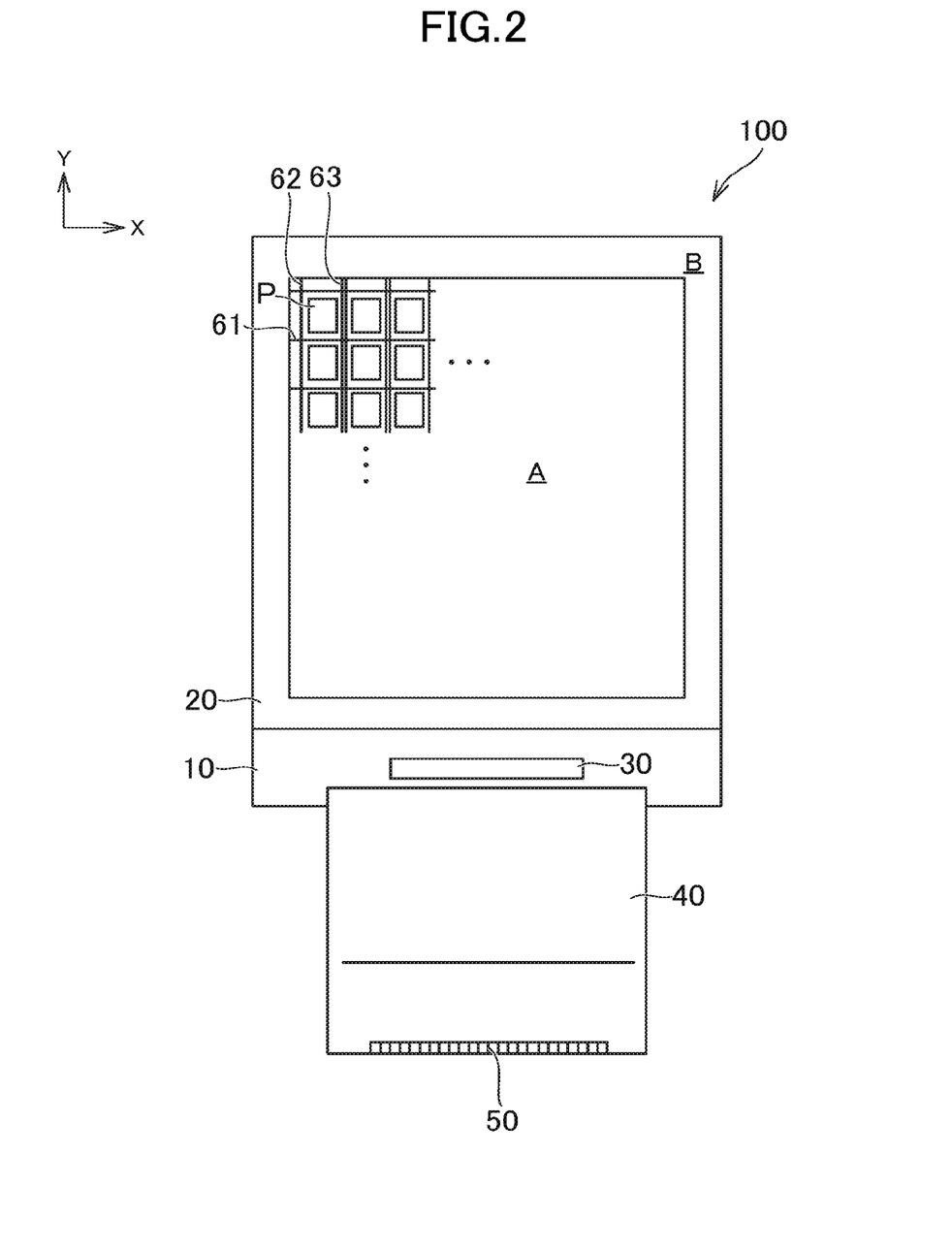
FIG. 2 is a plan view of the display device in the present embodiment.

The display device 100 in the present embodiment includes a substrate 10, which has a display area A, where a plurality of pixels P are each provided with a light emitting element and the pixels P are arranged in a matrix, a counter substrate 20, which faces the substrate 10, and a driver IC 30 (integrated circuit) and an FPC (flexible printed circuits) 40, which are provided in an exposed area of the substrate 10, as shown in FIGS. 1 and 2. The substrate 10 is divided into the display area A and a peripheral area B, which is located around the display area A. The pixels P are arranged in a matrix in the display area A of the substrate 10, and each of the plurality of pixels P is provided with a pixel circuit that will be described in the present embodiment. The FPC 40 is provided with a terminal section 50, which is connected to a controller circuit that controls a drive circuit. In the present embodiment, to make the display device 100 flexible, the substrate 10 is formed of a substrate having flexibility. The substrate 10 may be made, for example, of a polyimide resin.

With reference to FIG. 2, in the display area A, gate wiring lines 61 are arranged in an X direction (lateral direction) in FIG. 2, and signal lines 62 and power supply lines 63 are arranged in a Y direction (longitudinal direction) in FIG. 2, with the gate wiring lines 61 and the signal lines 62/power supply lines 63 arranged in a matrix. The pixels P correspond to the areas surrounded by the gate wiring lines 61, the signal lines 62, and the power supply lines 63. In FIG. 2, the pixels P are so drawn not as to coincide with the areas surrounded by the gate wiring lines 61, the signal lines 62, and the power supply lines 63 for ease of illustration, but the pixel areas may overlap with the wiring lines in a plan view.

[Circuit Diagram of Pixel]

The pixel circuit in the present embodiment will next be described with reference to FIG. 3.

Figure 3:
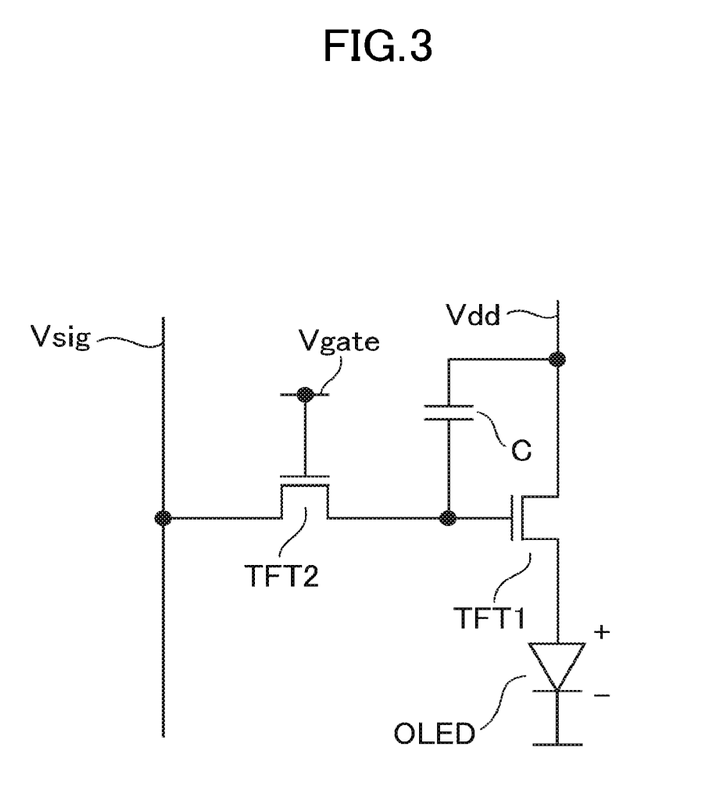
FIG. 3 is a circuit diagram showing a pixel circuit in the present embodiment.

The pixel circuit in the present embodiment is formed of a capacitor C, a TFT (thin film transistor) 1 and a TFT 2, a gate wiring line Vgate, a signal line Vsig, and a power supply line Vdd, as shown in FIG. 3. The gate of the TFT 2 is connected to the gate wiring line Vgate, the source of the TFT 2 is connected to the signal line Vsig, and the drain of the TFT 2 is connected to one end of the capacitor C and the gate of the TFT 1. When predetermined voltage is applied to the gate of the TFT 2, the TFT 2 provides the gate of the TFT 1 with potential according to the signal line Vsig. The voltage between the gate and the source of the TFT 1 is maintained by the capacitor C, and the TFT 1 supplies the anode of an OLED (organic light emitting diode) with current corresponding to the charge in the capacitor C via the power supply line Vdd. The cathode of the OLED is connected to a ground electrode or a negative-potential electrode.

[Configuration of Pixel]

Figure 4:
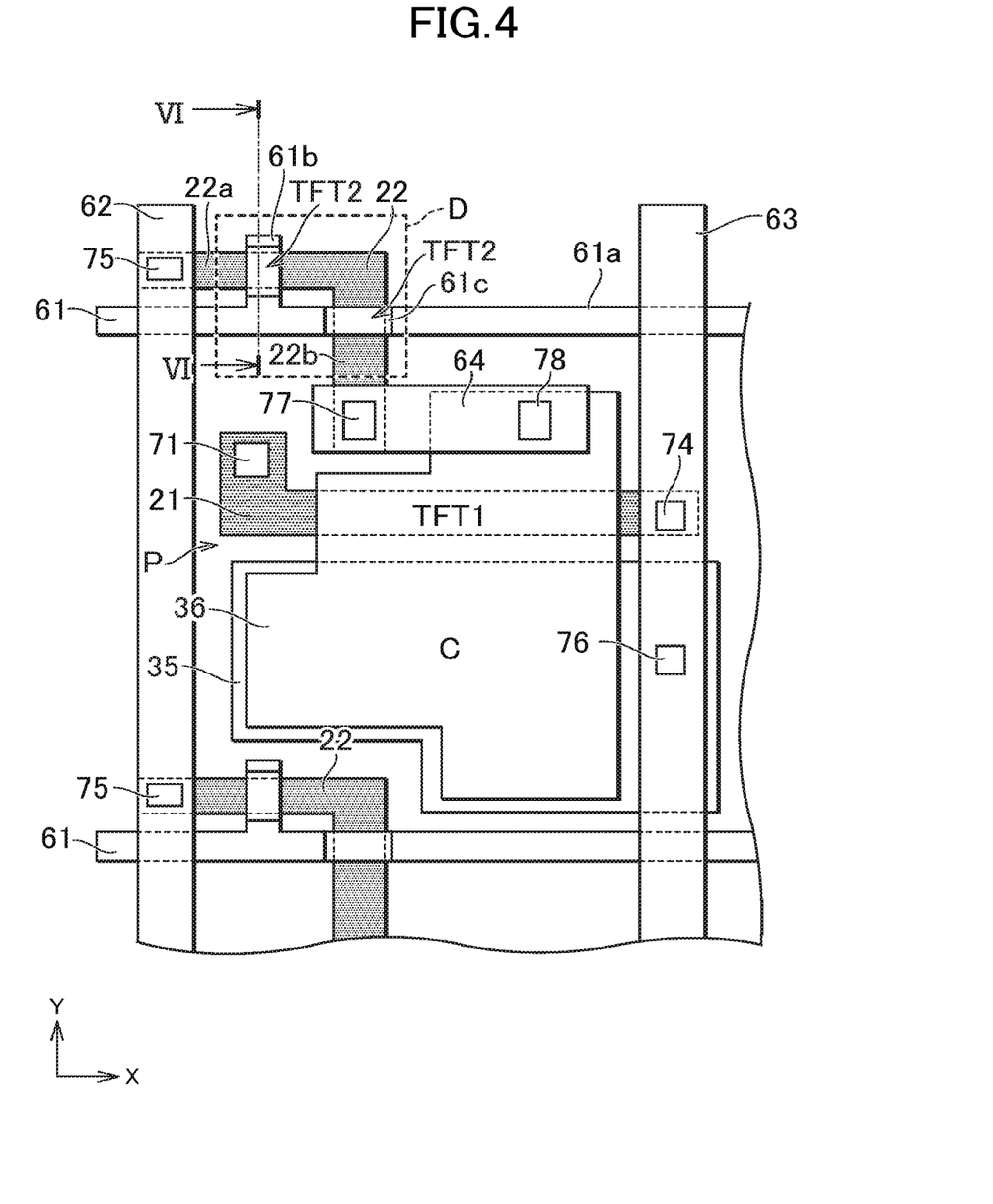
FIG. 4 is a plan transparent view of the display device viewed from the side facing a display area of the display device.

The structure of each of the pixels P in the present embodiment will next be described with reference to FIG. 4. FIG. 4 is a plan transparent view of the display device viewed from the side facing the display area of the display device and shows an area where one pixel P is disposed.

As shown in FIG. 4, in the pixel P, a low-temperature polysilicon (LTPS) layer 21, a semiconductor layer 22, and an electrode layer 35 are formed on the same insulating layer. The LTPS layer 21 serves as a channel semiconductor layer of a TFT that supplies the OLED with current via the power supply line 63, and the TFT corresponds to the TFT 1 in the circuit diagram of FIG. 3. The LTPS layer 21 may be replaced with a layer made of any of a variety of types of polycrystalline silicon.

The semiconductor layer 22 serves as a channel semiconductor layer of a TFT that provides the capacitor C with potential according to the signal line 62, and the TFT corresponds to the TFT 2 in the circuit diagram of FIG. 3. The semiconductor layer 22 may be made, for example, of an oxide semiconductor containing, indium, zinc, tin, orgallium or polysilicon. The semiconductor layer 22 is formed of a semiconductor layer 22a, which extends in the X direction and forms the source of the TFT 2, and a semiconductor layer 22b, which extends in the Y direction and forms the drain of the TFT 2.

The combination of the TFT 1 made of a low-temperature polysilicon and the TFT 2 made of an oxide semiconductor is presented by way of example. Instead, the combination of the TFT 1 made of an oxide semiconductor and the TFT 2 made of a low-temperature polysilicon may be employed. Still instead, each of the TFT 1 and the TFT 2 may be made of a low-temperature polysilicon or an oxide semiconductor.

In FIG. 4, the gate wiring lines 61 are linearly formed in the X direction (lateral direction) and each has an area where the gate wiring line 61 overlaps with the semiconductor layer 22b, and part of the gate wiring line 61 extends in the Y direction (longitudinal direction) to form an area that overlaps with the semiconductor layer 22a. In the present embodiment described in the following sections, the gate wiring line 61 is divided into the following portions: the area that extends in the X direction and does not overlap with the semiconductor layer 22 is defined as a gate wiring line 61a; the area that includes the area overlapping with the semiconductor layer 22a is defined as a gate electrode 61b; and the area that includes the area overlapping with the semiconductor layer 22b is defined as a gate electrode 61c.

The electrode layer 35 is electrically connected to the power supply line 63 and forms one end of the capacitor C in the circuit diagram of FIG. 3. An electrode layer 36 is electrically connected to the drain of the TFT 2 via a jumper wiring line 64 and forms the other end of the capacitor C. The electrodes layer 35 and 36, specifically, portions thereof facing each other with an insulating layer interposed therebetween form the capacitor C.

The signal line 62 is so formed as to extend in the Y direction in FIG. 4 in parallel to the power supply line 63. The semiconductor layer 22a and the signal line 62 overlap with each other and are electrically connected to each other via a via 75, which is formed in the area where the semiconductor layer 22a and the signal line 62 overlap with each other. The semiconductor layer 22b is electrically connected to the jumper wiring line 64 via a via 77, and the electrode layer 36 is electrically connected to the jumper wiring line 64 via a via 78.

The TFT 2 has a gate formed in the area where the gate electrode 61b and the semiconductor layer 22a overlap with each other and another gate in the area where the gate electrode 61c and the semiconductor layer 22b overlap with each other (each of the areas is also called a TFT channel section), and the vias 75 and 77 serve as the source electrode and the drain electrode of the TFT 2, respectively. As described above, the present embodiment is described with reference to the TFT2 having two gates or what is called a double-gate transistor, but not necessarily. The number of gates may be one or three or more.

The gate of the TFT1 is formed in the area where the LTPS layer 21 and the electrode layer 36 overlap with each other. The LTPS layer 21 and the power supply line 63 are electrically connected to each other via a via 74, and an anode contact hole 71 is formed in the LTPS layer 21, so that predetermined current is supplied via the power supply line 63 to the OLED.

The electrode layers 35 and 36 form the areas facing each other with an insulating layer interposed therebetween to form the capacitor C. In the view of the circuit diagram of FIG. 3, the electrode layer 35 forms the electrode of the capacitor C on the side facing the power supply line Vdd, and the electrode layer 36 forms the electrode of the capacitor C on the side facing the drain of the TFT 2 and the gate of the TFT 1. The electrode layer 36 is electrically connected to the jumper wiring line 64 via the via 78, so that the electrode layer 36 is electrically connected to the semiconductor layer 22b. The electrode layer 35 has an area that overlaps with the power supply line 63 and is electrically connected to the power supply line 63 via a via 76 formed in the area.

Although not shown, a planarizing layer and the anode of the OLED are formed on the signal line 62, the power supply line 63, and the jumper wiring line 64. The anode is formed in the pixel area surrounded by the gate wiring lines 61 on the upper and lower sides and the signal line 62 and the power supply line 63 on the left and right sides. A bank is formed around the anode and around the anode contact hole 71. As described above, in the present embodiment, the two different types of TFT, the TFT 1 having a channel semiconductor layer made of LTPS and the TFT 2 having a channel semiconductor layer made of an oxide semiconductor, are disposed on the same insulating layer, as shown in FIG. 4.

[Structure of Gate Electrode]

Figure 5:
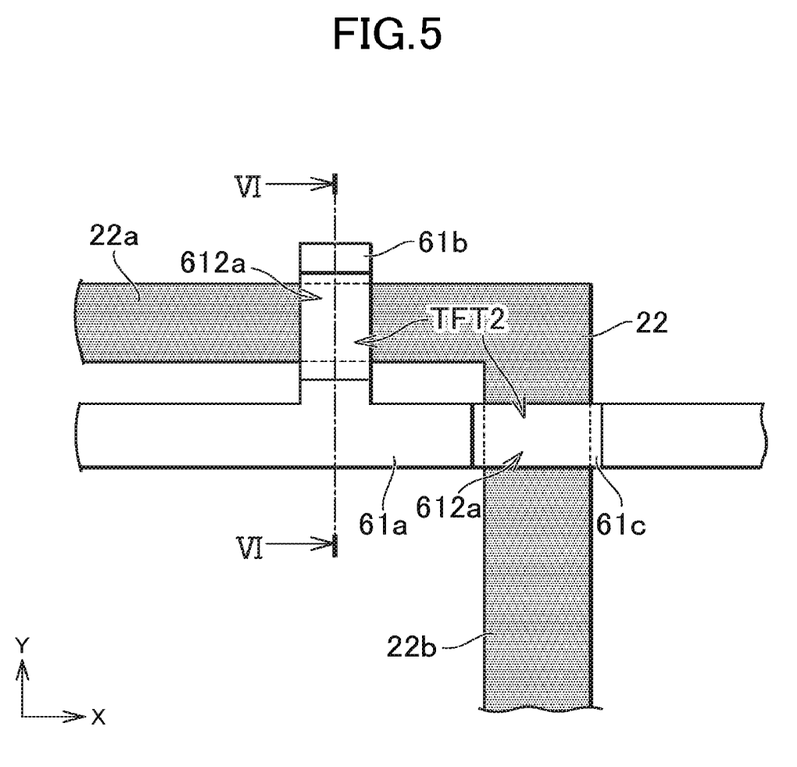
FIG. 5 is an enlarged view of an area surrounded by a broken line D in FIG. 4.
Figure 6:
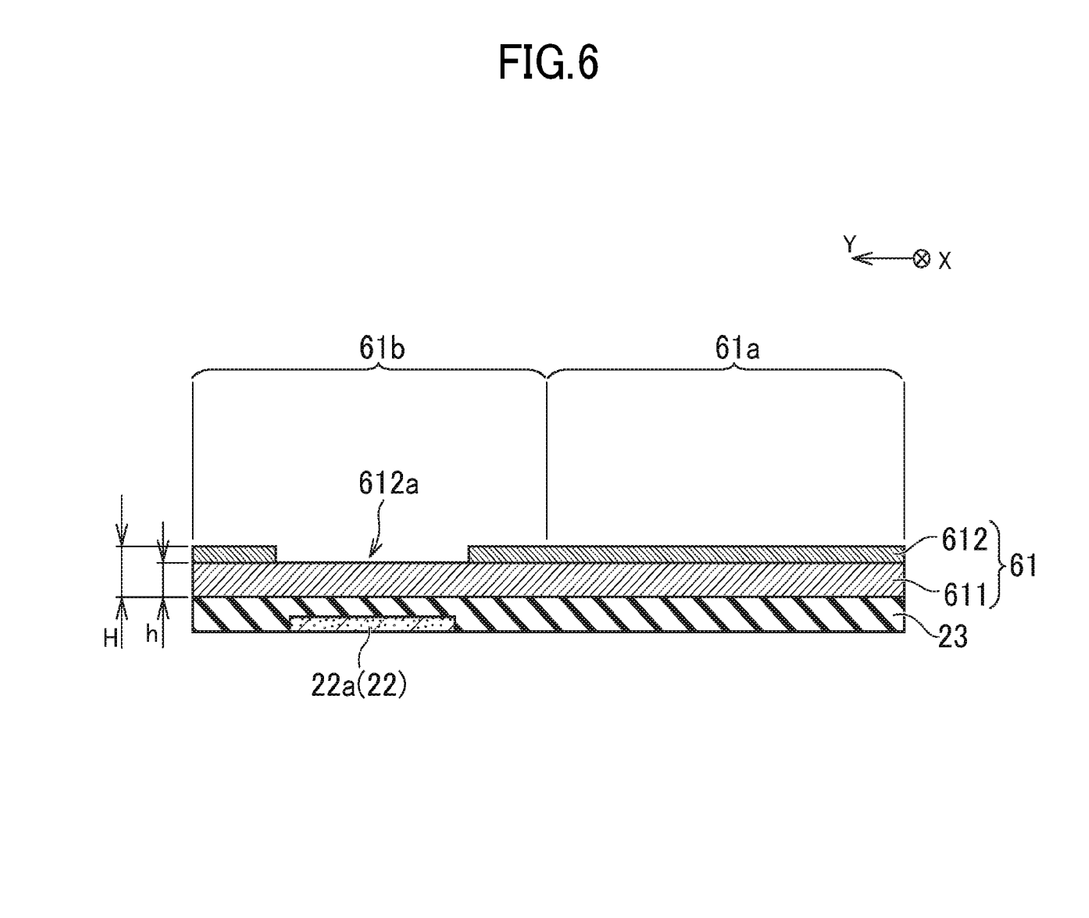
FIG. 6 is a cross-sectional view taken along the line VI-VI in FIGS. 4 and 5.

The structure of the gate electrode 61b in the present embodiment will next be described in detail with reference to FIGS. 5 and 6. FIG. 5 is an enlarged view of the area surrounded by a broken line D in FIG. 4. FIG. 6 is a cross-sectional view taken along the line VI-VI in FIGS. 4 and 5. FIG. 6 shows a cross section of the gate electrode 61b and the semiconductor layer 22a, which form one of the gates of the double-gate TFT 2 and will be described below. The other gate of the TFT 2 that is formed by the gate electrode 61c and the semiconductor layer 22b has the same cross-sectional shape and will therefore not be illustrated. A device including the transistor TFT2, the gate wiring line 61a, and the substrate 10 (see FIG. 1 and other figures) shown in FIG. 5 is defined as a semiconductor device. The display device 100 includes the semiconductor device and is so defined as a device having the display area A, which has the plurality of pixels P arranged on the substrate 10, with each of the plurality of pixels P including the transistor TFT2 and the gate wiring line 61a shown in FIG. 5.

As shown in FIG. 5, the gate wiring line 61a is so formed as to extend in the X direction, the gate electrode 61b is so formed as to be connected to the gate wiring line 61a and extend in the Y direction in such a way that the gate electrode 61b overlaps with the semiconductor layer 22a, and the gate electrode 61c is so formed as to be connected to the gate wiring line 61a and extend in the X direction in such a way that the gate electrode 61c overlaps with the semiconductor layer 22b. The gates of the TFT 2 are formed in the area where the gate electrode 61b overlaps with the semiconductor layer 22a and in the area where the gate electrode 61c overlaps with the semiconductor layer 22b. The gate electrode 61b has a planar shape having a lengthwise axis extending in the Y direction and a widthwise axis perpendicular to the lengthwise axis. Similarly, the area where the gate electrode 61b overlaps with the semiconductor layer 22a has a planar shape having a lengthwise axis extending in the Y direction and a widthwise axis perpendicular to the lengthwise axis. The gate electrode 61c has a planar shape having a lengthwise axis extending in the X direction and a widthwise axis perpendicular to the lengthwise axis. Similarly, the area where the gate electrode 61c overlaps with the semiconductor layer 22b has a planar shape having a lengthwise axis extending in the X direction and a widthwise axis perpendicular to the lengthwise axis.

A gate insulating film 23 is so provided on the semiconductor layer 22a as to cover the semiconductor layer 22a, as shown in FIG. 6. The gate wiring line 61a and the gate electrode 61b are provided on the gate insulating film 23, and the gate insulating film 23 is so provided as to be sandwiched between the semiconductor layer 22a and the gate electrode 61b.

In the present embodiment, to make the display device 100 flexible, the substrate 10, on which the gate electrode 61b and other components are provided, is formed of a substrate having flexibility. The TFT 2 is formed in a bendable area of the substrate 10. In general, among the gate electrodes 61b and 61c, the semiconductor layer 22, and the gate insulating film 23, which form the TFT 2, each of the gate electrodes 61b and 61c has the largest film thickness, and it is therefore believed that the gate electrodes 61b and 61c are prone to a mechanical defect and other disadvantageous phenomena due to bending stress induced therein. Therefore, when the substrate 10 is repeatedly bent, the characteristics of the TFT 2 could undesirably change due to the bending stress induced in the gate electrodes 61b and 61c. For example, if the threshold voltage, starting characteristics, and other characteristics of the TFT 2 change, the changes affect image display operation, possibly resulting in decrease in the life of the display device 100.

To avoid the situation described above, in the present embodiment, a step is formed in a surface of the gate electrode 61b on a side opposite the gate insulating film 23 so that the gate electrode 61b has a recess 612a, as shown in FIG. 6. In other words, the gate electrode 61b has an area that is thinner than the gate wiring line 61a and located in the area where the gate electrode 61b overlaps with the semiconductor layer 22a. The recess 612a is provided at least in the area where the gate electrode 61b overlaps with the semiconductor layer 22a. Specifically, the recess 612a is so configured that H>h is satisfied, where H represents the thickness of the gate wiring line 61a, and h represents the thickness of the reduced thickness area (recess 612a) of the gate electrode 61b. Although not illustrated in the form of a cross-sectional view, the gate electrode 61c also has a recess 612a in the area where the gate electrode 61c overlaps with the semiconductor layer 22b, as in the case of the gate electrode 61b.

As described above, each of the gate electrodes 61b and 61c formed in the bendable area of the substrate 10 is configured to have a reduced thickness area, whereby stress induced in the gate electrodes 61b and 61c when the substrate 10 is bent can be lowered with no limitation on the arrangement of the TFT 2. As a result, variation in the characteristics of the TFT 2 can be suppressed. Further, in the present embodiment, low resistance of the gate wiring line 61a can be maintained because the thickness of the gate wiring line 61a is not reduced.

In a case where the configuration described above is employed and the TFT 2 is so arranged that the direction in which the substrate 10 is bent coincides with the direction in which the widthwise axis of the area where the gate electrode 61b overlaps with the semiconductor layer 22a is bent, variation in the characteristics of the TFT 2 that occurs in the gate electrode 61b can be further suppressed. In the present embodiment, the entire recesses 612a of the gate electrodes 61b and 61c overlap with the semiconductor layers 22a and 22b, respectively, but not necessarily. The recesses 612a may instead be so formed that at least part thereof overlaps with the semiconductor layers 22a and 22b. Further, the number of recesses 612a provided in each of the gate electrodes 61b and 61c is not limited to one. For example, a plurality of recesses 612a may be formed alongside in the lengthwise axis direction of the gate electrodes 61b and 61c (direction in which gate electrodes 61b and 61c extend).

Further, as shown in FIG. 6, the gate wiring line 61 is formed of an aluminum layer 611 and a titanium layer 612 in the present embodiment. The reduced thickness portion of the gate electrode 61b is formed only of the aluminum layer 611. Aluminum (Al) is a metal that excels in extensibility and crack resistance against force due to bending stress, as compared with titanium (Ti). As described above, not only simply forming the reduced thickness portion in the gate electrode 61b but also forming the reduced thickness portion of the gate electrode 61b by using only the aluminum layer 611 allows the stress induced in the gate electrode 61b when the substrate 10 is bent to be lowered. In the present embodiment, the thickness of the aluminum layer 611 is set at about 250 nm, and the thickness of the titanium layer 612 is set at about 150 nm.

[Process of Reducing Thickness of Gate Electrode]

The process of reducing the thickness of the gate electrodes in the present embodiment will next be described with reference to FIGS. 7A to 7D. FIGS. 7A to 7D describe the process of reducing the thickness of the gate electrodes in the present embodiment and show cross sections corresponding to the VI-VI cross section in FIGS. 4 and 5. In the following description, the process of reducing the thickness of the gate electrode 61b will be described, and the process of reducing the thickness of the gate electrode 61c will not be described because the gate electrodes 61b and 61c are processed in the same manner.

The insulating film 23 is first so formed as to cover the semiconductor layer 22a. Further, the aluminum layer 611 is formed on the insulating film 23, and the titanium layer 612 is formed on the aluminum layer 611. The aluminum layer 611 and the titanium layer 612 form the gate wiring line 61 (gate wiring line 61a and gate electrode 61b) described above. A resist 70 is then applied onto the titanium layer 612 to achieve the state shown in FIG. 7A.

A resist pattern that conforms to the gate wiring line 61 is then formed by light exposure. In this process, a recess 70a is so formed that the thickness of the resist that will form the gate electrode 61b, which is so provided as to overlap with the semiconductor layer 22a, is smaller than the thickness of the other portion, for example, in photolithography using a halftone mask to achieve the state shown in FIG. 7B. In this state, the gate wiring line 61 is patterned in accordance with the shape of the resist 70. Part of the resist 70 including the reduced thickness portion is then removed by ashing using oxygen, so that the resist in the portion corresponding to the recess 70a is taken away, and the titanium layer 612 is exposed.

Only the titanium layer 612 of the gate electrode 61b in the reduced thickness portion is then removed by dry etching using a fluorine radical. That is, only the aluminum layer 611 is left as the reduced thickness portion of the gate electrode 61b to achieve the state shown in FIG. 7C. Since an aluminum fluoride has a high boiling point, etching using a fluorine radical allows selective removal of only titanium.

Figure 7A:
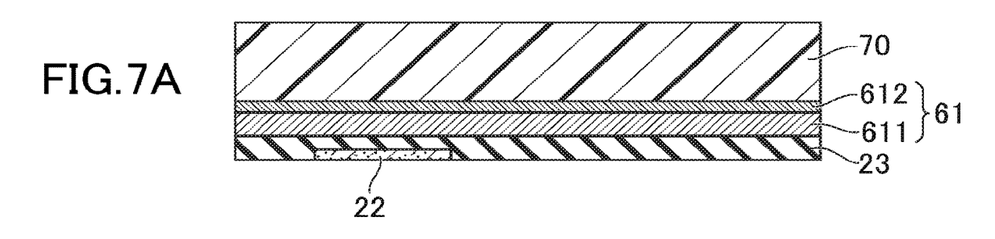
FIG. 7A describes the process of reducing the thickness of a gate electrode in the present embodiment.
Figure 7B:
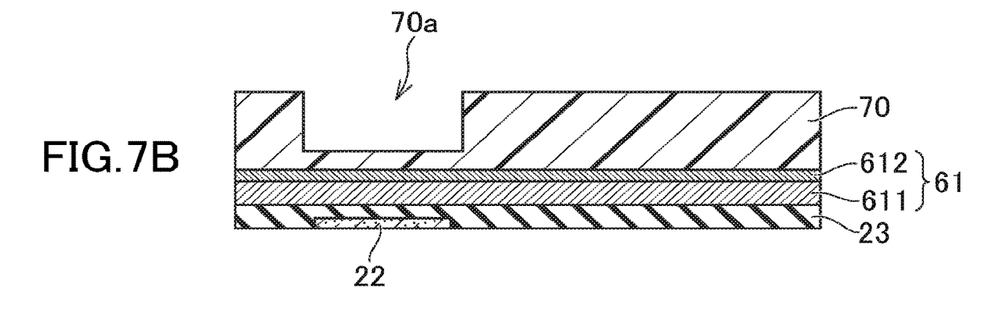
FIG. 7B describes the process of reducing the thickness of the gate electrode in the present embodiment.
Figure 7C:
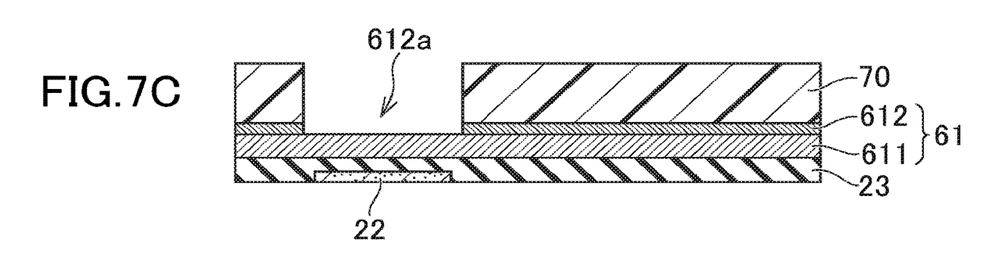
FIG. 7C describes the process of reducing the thickness of the gate electrode in the present embodiment.
Figure 7D:
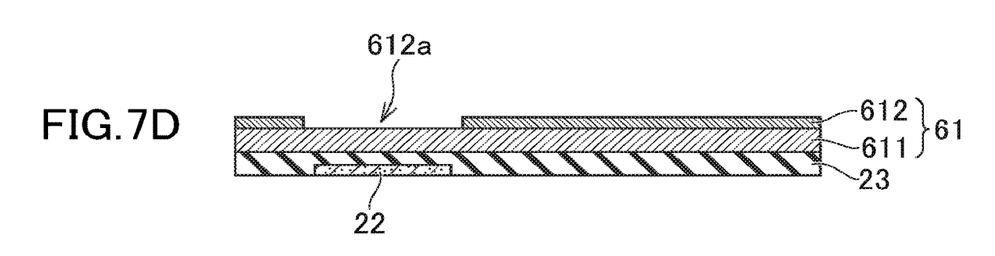
FIG. 7D describes the process of reducing the thickness of the gate electrode in the present embodiment.

The resist is then completely removed by ashing using oxygen. After the steps described above, the thickness of only part of the gate electrode 61b is reduced, and the recess 612a can thus be formed, as shown in FIGS. 7D and 6.

In the present embodiment, the TFT 2 is a top-gate TFT. The TFT 2 may instead be a TFT having a different structure, for example, a bottom-gate TFT.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor device comprising:
    a substrate having flexibility;
    a transistor having a gate insulating film and further having a semiconductor layer and a gate electrode that sandwich the gate insulating film, is formed in an area where the substrate is bent; and
    a gate wiring line so formed on the substrate but in an area where the gate wiring line does not overlap with the semiconductor layer as to be connected to the gate electrode,
    wherein the gate electrode has a recess that is present in an area where the gate electrode overlaps with the semiconductor layer and the gate electrode in the recess is thinner than at least part of the gate wiring line,
    a wall of the recess includes titanium,
    the gate electrode has a first surface facing to the semiconductor layer and a second surface opposite to the first surface,
    the recess is located at the second surface,
    the gate electrode has a portion next to the recess in plan view, and
    a distance between a bottom of the recess and a bottom of the gate insulating film is equal to a distance between a bottom of the portion and the bottom of the gate insulating film.

2. The semiconductor device according to claim 1,
    wherein the area where the gate electrode overlaps with the semiconductor layer has a planar shape having a lengthwise axis and a widthwise axis perpendicular to the lengthwise axis, and
    a direction in which the substrate is bent in the area where the transistor is formed coincides with a direction in which the widthwise axis is bent.

3. The semiconductor device according to claim 1,
    wherein a step is formed in a surface of the gate electrode on a side opposite the gate insulating film so that the gate electrode has the recess.

4. The display device according to claim 1, wherein
    the recess has a first length from one side of the wall to another side of the wall,
    the semiconductor layer has a second length,
    the first length and the second length are parallel,
    the first length is longer than the second length.

5. A display device comprising:
    a substrate having flexibility;
    a plurality of pixels provided on the substrate to form a display area;
    a transistor having a gate insulating film and further having a semiconductor layer and a gate electrode that sandwich the gate insulating film, is formed in an area where the substrate is bent; and a gate wiring line so formed on the substrate but in an area where the gate wiring line does not overlap with the semiconductor layer as to be connected to the gate electrode, wherein the gate electrode has a recess that is present in an area where the gate electrode overlaps with the semiconductor layer and the gate electrode in the recess is thinner than at least part of the gate wiring line, a wall of the recess includes titanium, the gate electrode has a first surface facing to the semiconductor layer and a second surface opposite to the first surface, the recess is located at the second surface, the gate electrode has a portion next to the recess in plan view, and a distance between a bottom of the recess and a bottom of the gate insulating film is equal to a distance between a bottom of the portion and the bottom of the gate insulating film.

6. The display device according to claim 5, wherein the area where the gate electrode overlaps with the semiconductor layer has a shape having a lengthwise axis and a widthwise axis perpendicular to the lengthwise axis, and a direction in which the substrate is bent in the area where the transistor is formed coincides with a direction in which the widthwise axis is bent.

7. The display device according to claim 5, wherein a step is formed in a surface of the gate electrode on a side opposite the gate insulating film so that the gate electrode has the recess.

8. The display device according to claim 5, wherein each of the plurality of pixels is provided with the transistor.

9. The display device according to claim 5, wherein the recess has a first length from one side of the wall to another side of the wall, the semiconductor layer has a second length, the first length and the second length are parallel, the first length is longer than the second length.

10. A display device comprising:

a substrate having a bending part;

a plurality of pixels provided on a display area, each of the plurality of pixels at the bending part including a transistor having a gate insulating film, a semiconductor layer and a gate electrode; and a gate wiring line being connected to the gate electrode, wherein the gate insulating film is between the semiconductor layer and the gate electrode, the gate wiring line does not overlap with the semiconductor layer in plan view, the gate electrode has a recess that overlaps with the semiconductor layer in plan view, the gate electrode in the recess is thinner than the gate wiring line, a wall of the recess includes titanium, the gate electrode has a first surface facing to the semiconductor layer and a second surface opposite to the first surface, the recess is located at the second surface, the gate electrode has a portion next to the recess in plan view, and a distance between a bottom of the recess and a bottom of the gate insulating film is equal to a distance between a bottom of the portion and the bottom of the gate insulating film.

11. The display device according to claim 10, wherein the substrate has flexibility.

12. The display device according to claim 10, wherein the area where the gate electrode overlaps with the semiconductor layer has a shape having a lengthwise axis and a widthwise axis perpendicular to the lengthwise axis, and a direction in which the substrate is bent in the area where the transistor is formed coincides with a direction in which the widthwise axis is bent.

13. The display device according to claim 10, wherein a step is formed in a surface of the gate electrode on a side opposite the gate insulating film so that the gate electrode has the recess.

14. The display device according to claim 10, wherein the recess has a first length from one side of the wall to another side of the wall, the semiconductor layer has a second length, the first length and the second length are parallel, the first length is longer than the second length.

* * * * *